US010073350B2

(12) United States Patent
Bencher

(10) Patent No.: US 10,073,350 B2
(45) Date of Patent: Sep. 11, 2018

(54) MASKLESS LITHOGRAPHY FOR WEB BASED PROCESSING

(71) Applicant: Applied Materials, Inc., Santa Clara, CA (US)

(72) Inventor: Christopher Dennis Bencher, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/026,810

(22) PCT Filed: Sep. 25, 2014

(86) PCT No.: PCT/US2014/057348
§ 371 (c)(1),
(2) Date: Apr. 1, 2016

(87) PCT Pub. No.: WO2015/060983
PCT Pub. Date: Apr. 30, 2015

(65) Prior Publication Data
US 2016/0238941 A1 Aug. 18, 2016

Related U.S. Application Data

(60) Provisional application No. 61/894,328, filed on Oct. 22, 2013.

(51) Int. Cl.
*G03B 27/42* (2006.01)
*G03F 7/20* (2006.01)
(Continued)

(52) U.S. Cl.
CPC .............. *G03F 7/2051* (2013.01); *G03F 7/24* (2013.01); *G03F 7/703* (2013.01);
(Continued)

(58) Field of Classification Search
CPC .... G03F 7/0002; G03F 7/2051; G03F 9/7088; G03F 9/7042; G03F 7/70291;
(Continued)

(56) References Cited

U.S. PATENT DOCUMENTS 5,691,541 A 11/1997 Ceglio et al.
6,246,064 B1 * 6/2001 Sasaki ................... B82Y 10/00
250/491.1
(Continued)

FOREIGN PATENT DOCUMENTS

| CN | 1510519 A | 7/2004 |
| CN | 1574222 | 2/2005 |
| JP | 2006-098719 A | 4/2006 |

OTHER PUBLICATIONS

Chinese Office Action dated Mar. 3, 2017 (with attached English translation of Search Report) for Chinese Patent Application No. 201480058382.1.
(Continued)

*Primary Examiner* — Mesfin Asfaw
(74) *Attorney, Agent, or Firm* — Patterson + Sheridan LLP

(57) ABSTRACT

The present disclosure generally relates to a method and apparatus for processing a web-based substrate. As the substrate travels between rollers, the substrate may be stretched and thus distorted. Once the substrate reaches the roller, the substrate distortion is fixed. By adjusting the processing parameters, the distorted substrate is processed without correcting the distortion.

17 Claims, 5 Drawing Sheets

(51) Int. Cl.
  *G03F 7/24*         (2006.01)
  *G03F 9/00*         (2006.01)
(52) U.S. Cl.
  CPC ............ *G03F 7/70791* (2013.01); *G03F 9/00* (2013.01); *G03F 9/7003* (2013.01); *G03F 9/7084* (2013.01)
(58) Field of Classification Search
  CPC ................. G03F 9/7003; G03F 9/7019; G03F 2009/005; G03F 9/7046; G03F 9/7069; G03F 9/7084; G03F 7/20; G03F 7/70683; G03F 9/7034; G03F 7/2022; G03F 7/705; G03F 7/70616; G03F 7/70783
  See application file for complete search history.

(56) References Cited

U.S. PATENT DOCUMENTS

| | | |
|---|---|---|
| 2006/0033902 A1 | 2/2006 | Latypov et al. |
| 2006/0066649 A1 | 3/2006 | Hirashima et al. |
| 2007/0231717 A1 | 10/2007 | Rivers et al. |
| 2009/0042139 A1 | 2/2009 | Shiraishi et al. |
| 2011/0253425 A1 | 10/2011 | Haase et al. |
| 2012/0286173 A1 | 11/2012 | Van De Peut et al. |

OTHER PUBLICATIONS

International Search Report and Written Opinion, PCT/US2014/057348, dated Dec. 24, 2014.
EPO Supplementary European Search Report dated Jun. 13, 2017, for European Patent Application No. 14856312.5.

* cited by examiner

MASKLESS LITHOGRAPHY FOR WEB BASED PROCESSING

BACKGROUND

Field

Embodiments of the present disclosure generally relate to a method and apparatus for processing a web-based substrate.

Description of the Related Art

In web-based substrate processing, a substrate moves over rollers and is processed at one or more processing locations. As opposed to static processing, a web-based substrate may be processed as the substrate continuously moves through the system. As such, the substrate position is constantly changing, which is particularly noticeable in web-based substrate processing. The web-based substrate travels over rollers. When on the rollers, the substrate position is generally fixed. However, between rollers, the substrate may be stretched or move perpendicular/lateral to the path upon which the substrate is traveling. Stated another way, the substrate may wander so that when the substrate encounters the roller, the substrate is not in the same position on the roller for the entire length of the web-based substrate.

In addition to wandering, the substrate can be distorted such that the substrate "bunches up" or compresses in laterally relative to the substrate movement direction. When the distorted substrate reaches the roller, the distortion is generally fixed such that the distortion doesn't change for the portion of the substrate in contact with the roller. Processing a distorted substrate can pose numerous problems as the distortion can change along the length of the substrate as the substrate is moving through the system. Thus, either the substrate needs to be undistorted or the processing conditions need to change to compensate for the distortion.

One method to solve the substrate distortion problem is to use Self Aligned Imprint Lithography (SAIL). SAIL simply transfers the alignment problems among multiple lithography steps to multiple etching steps and is currently commercially impractical. SAIL processing requires a significant financial investment and very stringent system layouts and design rules.

Therefore, there is a need in the art for a method to process web-based substrates in a manner other than SAIL.

SUMMARY

The present disclosure generally relates to a method and apparatus for processing a web-based substrate. As the substrate travels between rollers, the substrate may be stretched and thus distorted. Once the substrate reaches the roller, the substrate distortion is fixed. By adjusting the processing parameters, the distorted substrate is processed without correcting the distortion.

In one embodiment, a method of processing a web substrate comprises detecting that the substrate is distorted; and photolithographically processing the distorted substrate based upon the detected distortion.

In another embodiment, a web-based processing apparatus comprises a roller disposed in a chamber body; an alignment measuring device; a CPU coupled with the alignment measuring device; a processing device coupled to the CPU; and an image shaper disposed between the processing device and the roller, wherein the image shaper is capable of creating a convex and cylindrical field shape to match a shape of the roller.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
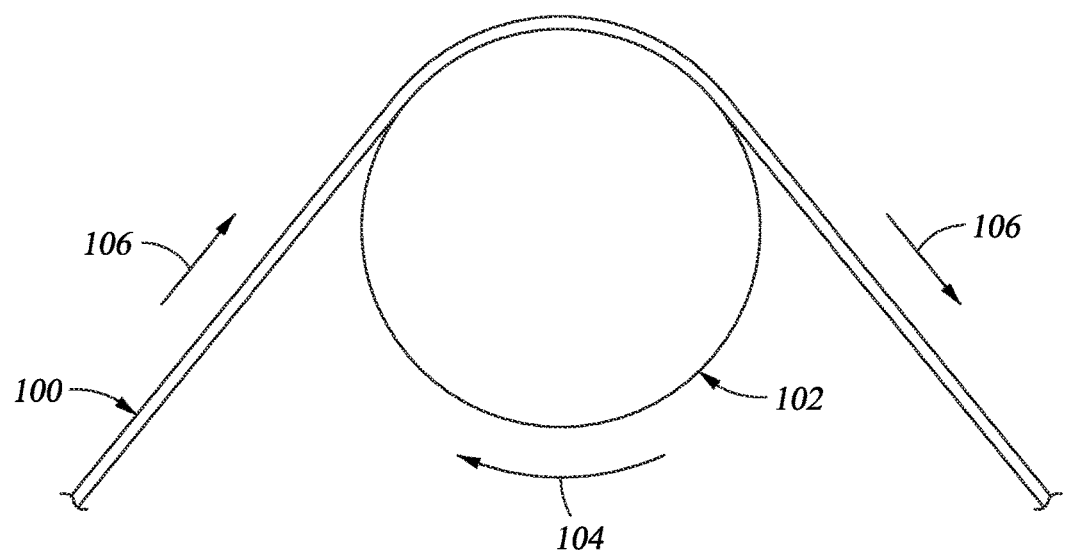
FIG. 1 is a schematic illustration of a web-based substrate passing over a roller.

The present disclosure generally relates to a method and apparatus for processing a web-based substrate. As the substrate travels between rollers, the substrate may be stretched and thus distorted. Once the substrate reaches the roller, the substrate distortion is fixed. By adjusting the processing parameters, the distorted substrate is processed without correcting the distortion.

Embodiments discussed herein may be practiced in a web-based apparatus such as the Applied SmartWeb® apparatus available from Applied Materials, Inc., Santa Clara, Calif. It is to be understood that the embodiments may be practiced on other apparatus as well, including those sold by other manufacturers.

Embodiments of the present disclosure relate to forming photolithographic patterns on flexible substrates, such as thin plastic substrates. Plastic substrates have natural tendency to deform during operation causing large overlay errors between layers of patterns in mask lithography. Embodiments of the present solution provide solutions for maskless photolithography on plastic substrates.

The embodiments involve conveying the substrate by a roller, focusing a camera at a leading edge of the roller, and directing one or more DMD writers to the substrate at a location downstream from the camera. Both the camera and DMD writer are directed towards the portions of the substrate that are on the roller, so that the distances between the camera/substrate and DMD writer/substrate are constant, thus eliminating problems caused by the substrate moving out of focus.

During photolithography of a first pattern layer on the substrate, alignment marks are printed on the kerf region between devices; the alignment marks are used to indicate distortion along the orthogonal or lateral direction. Any distortion along the longitudinal direction may be considered uniform. Parallel lines or marks are printed along the longitudinal direction to reflect wandering of the substrate.

During photolithography of a second pattern layer, a sampling of the alignment marks is performed using the camera; the substrate distortion is calculated from the sampled image of the alignment marks; and a GDS II file is updated/formed incorporating the calculated distortion. The information from GDS II file is sent to the DMD writer to print the second pattern layer. By distorting the digital mask according to the distortion of the substrate, the distortion of the substrate may be compensated.

Distortion is monitored during the process of the web-based substrate. Associated distortion data with each product (such as an individual device) formed on the substrate is gathered. The distortion information may be used to indicate the product quality. Any spike in distortion may be flagged for a potential yield alert. When the distortion reaches steady state during operation, multi-point trailing average of distortion may be used to calculate GDS II image for printing, thus improve accuracy of the entire web-based substrate.

Because the substrate is on a curved plane during printing, the pitch of pattern may stretch from the center towards leading end and tail end of the curve plane. Mathematical calculations can be used to compensate for the stretch in the GDS II image. Alternatively, a roller with a large enough diameter may be used so that the pitch stretch is negligible. Traditional optical systems for the DMD writer have concave image planes while the substrate is placed on a convex surface of the roller. The error between the image plane and the substrate location may cause the DMD to lose accuracy and sharpness. A convex plane image shaper may be positioned between the DMD writer and the roller to solve the problem. The convex plane image shaper may be meniscus lens, field lens or triplett. The convex plane image shaper enables the use of a roller with a small diameter.

FIG. 1 is a schematic illustration of a web-based substrate 100 passing over a roller 102. As the roller 102 rotates as shown by arrows 104, the substrate 100 travels in the direction of arrow 106 over the roller 102. Prior to reaching the roller 102, the substrate 100 is not fixed in place and thus can wander as discussed above. Once the substrate 100 is on the roller 102, the portion of the substrate 100 on the roller 102 wanders no more and is thus fixed in place. If there are any distortions to the substrate 100 at the time the substrate 100 reaches the roller 102, then the distortions are fixed in place.

Figure 2A:
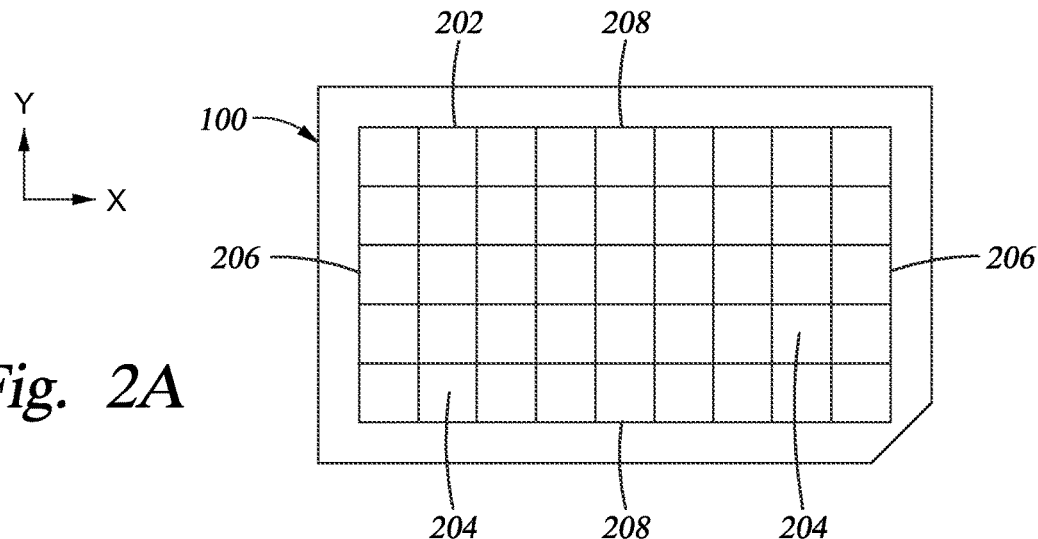
FIGS. 2A-2C are schematic illustrations of a web-based substrate showing distortions.
Figure 2B:
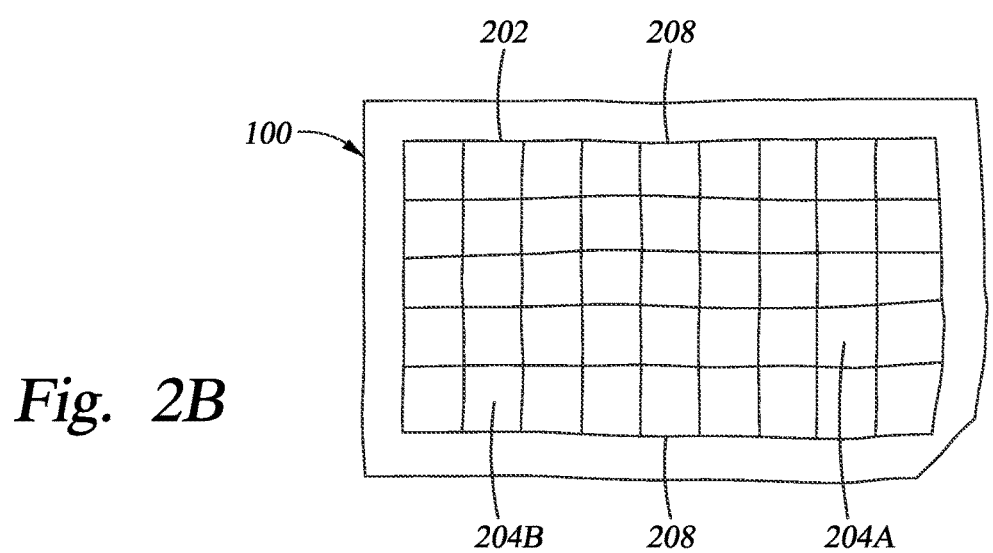
Figure 2C:
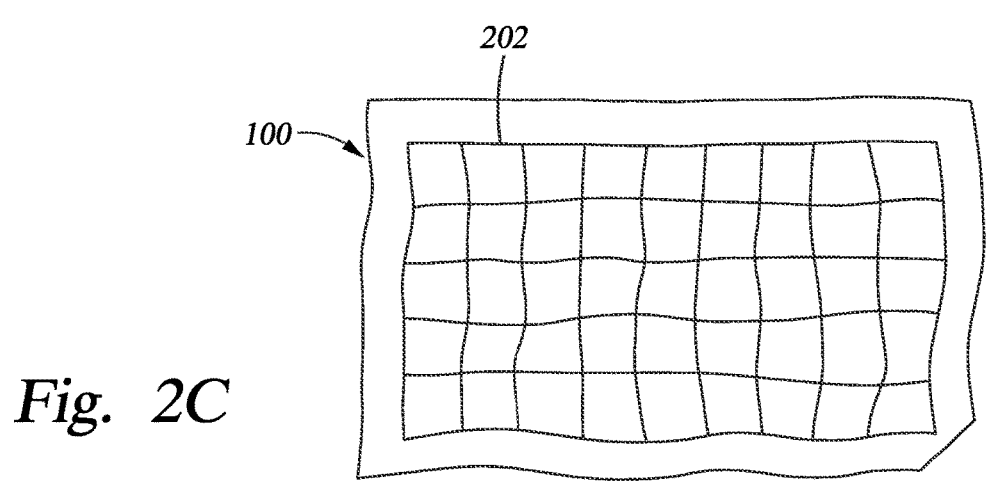

FIGS. 2A-2C are schematic illustrations of a web-based substrate 100 showing distortions. A pattern 202 is shown in the substrate 100. The pattern 202 consists of a plurality of identical squares 204. As shown in FIG. 2A, the squares 204 are all shown to be identical. However, in FIG. 2B, the exact same squares 204 are slightly distorted because the substrate 100 has stretched and/or compressed in both the "X" and "Y" directions. As is clearly shown in FIG. 2B, the end line 206 of the pattern 202 and the sideline 208 of the pattern 202 is different than in FIG. 2A. Furthermore, some squares 204A are larger in FIG. 2B as compared to FIG. 2A and some squares 204B are smaller in FIG. 2B as compared to FIG. 2A. In FIG. 2C, the distortion is even more pronounced. If the substrate 100 were to reach the roller 102 while distorted as shown in FIGS. 2B and 2C, then the substrate 100 would need to be processed while distorted.

Figure 3:
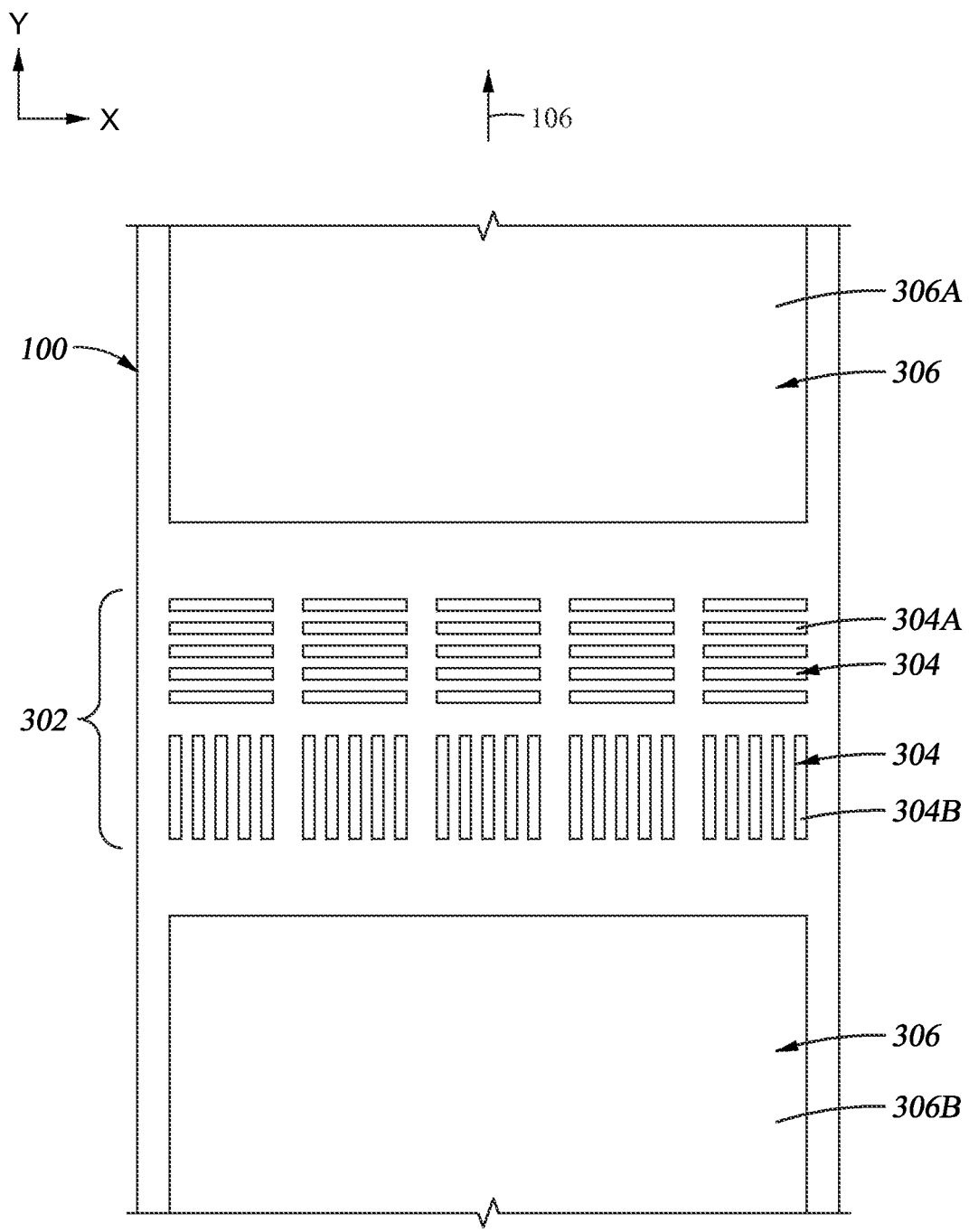
FIG. 3 is a schematic illustration of a web-based substrate having alignment markers.

In order to process a distorted substrate 100, the distortion needs to be understood. It has been discovered that strategically placing alignment markers 304 on the substrate 100 is beneficial. More specifically, alignment markers 304 are placed on the substrate 100 in a kerf region 302 between products 306 formed on the substrate 100. FIG. 3 is a schematic illustration of a web-based substrate 100 having alignment markers 304. The alignment markers 304 are disposed in the kerf region 302 between products 306 on the substrate 100. The alignment markers 304 include markers 304A extending laterally across the substrate 100 and markers 304B extending longitudinally in the direction the substrate 100 travels through the system.

The lateral markers 304A are used to measure the amount of distortion in the "X" direction while longitudinal markers 304B are used to measure the amount of distortion in the "Y" direction. The markers 304 are placed across the width of the substrate 100 in the kerf region 302 between the products 306. The distortion of the markers 304 is measured once the kerf region 302 is over the roller 102. Thus, the markers 304 are measured once the distortion is fixed. Based upon the measured distortion, the distortion of the product 306B is known and the processing conditions for processing product 306B can be tailored to match the distortion of the substrate 100. It should be noted that the distortion of substrate 100 may be different at each product 306 and thus, the processing conditions for product 306A may be different than for product 306B. The alignment markers 304 are used to determine the distortion for the next product to reach the roller.

Figure 4:
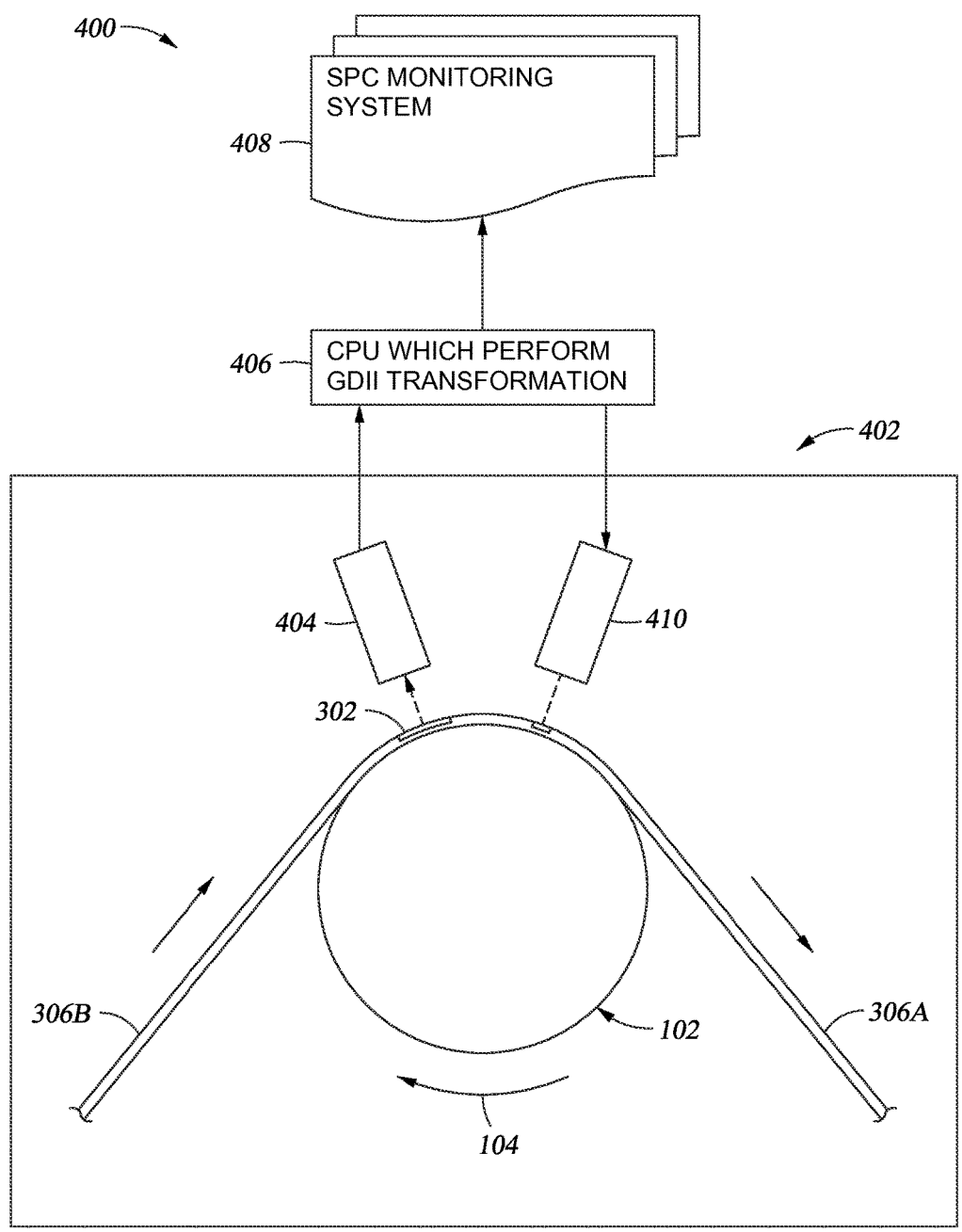
FIG. 4 is a schematic illustration of an apparatus according to one embodiment.

FIG. 4 is a schematic illustration of an apparatus 400 according to one embodiment. The apparatus 400 includes the roller 102. The substrate 100 enters the chamber 402 of the apparatus 400 and proceeds over the roller 102. Within the chamber 402, an alignment measuring device 404, such as a camera, collects data on the location of the alignment markers 304 and feeds the data into a CPU 406 that performs the calculations to determine the distortion of the substrate 100 and hence, the processing conditions necessary for processing the next product 306B. Based upon the data, the processing device 410, such as a DMD writer or photolithographic device, is fed the necessary information to process product 306B.

If desired, the data can be sent to a statistical processing control (SPC) monitoring system 408 can be used to process the data prior to sending the processing information to the processing device 410. The SPC monitoring system 408 follows a premise of a generally steady state of distortion for the substrate 100 and thus takes a statistical average of the distortion measurements and, based upon the statistical average distortion, sends processing information to the processing device 410. In other words, when the SPC monitoring system 408 is used, the distortion compensation for processing the product 306B is based upon a statistical average distortion for the entire substrate 100 rather than based solely upon measurements of the kerf region 302 just prior to the product 306B to be processed. It is believed that the substrate 100 should reach a generally steady state of distortion due to the length of the web-based substrate 100. If no steady state condition of distortion is present, then statistically speaking, there is an equipment problem. The SPC monitoring system 408 can use a rolling or trailing point average to determine the distortion of the substrate 100 and thus process product 306B according to the average distortion. Alternatively, if steady state distortion cannot be achieved, the products 306 can be processed based upon information gathered from the kerf region 302 directly before each product 306 on the substrate 100.

Because the substrate 100 is processed on the roller 102, the substrate is curved relative to the processing device 410. Hence, the processing is not occurring on a plane. As such, the focal plane needs to be convex in order to ensure the substrate 100 is properly processed. Most lens systems generate a natural concave focal plane curvature. Typical field flattening options include thick meniscus lenses with different radius, field lenses and triplett group lenses. As the objective is to expose a substrate that is convex relative to the processing device, the field compensation device needs to have a convex focal plane.

Figure 5:
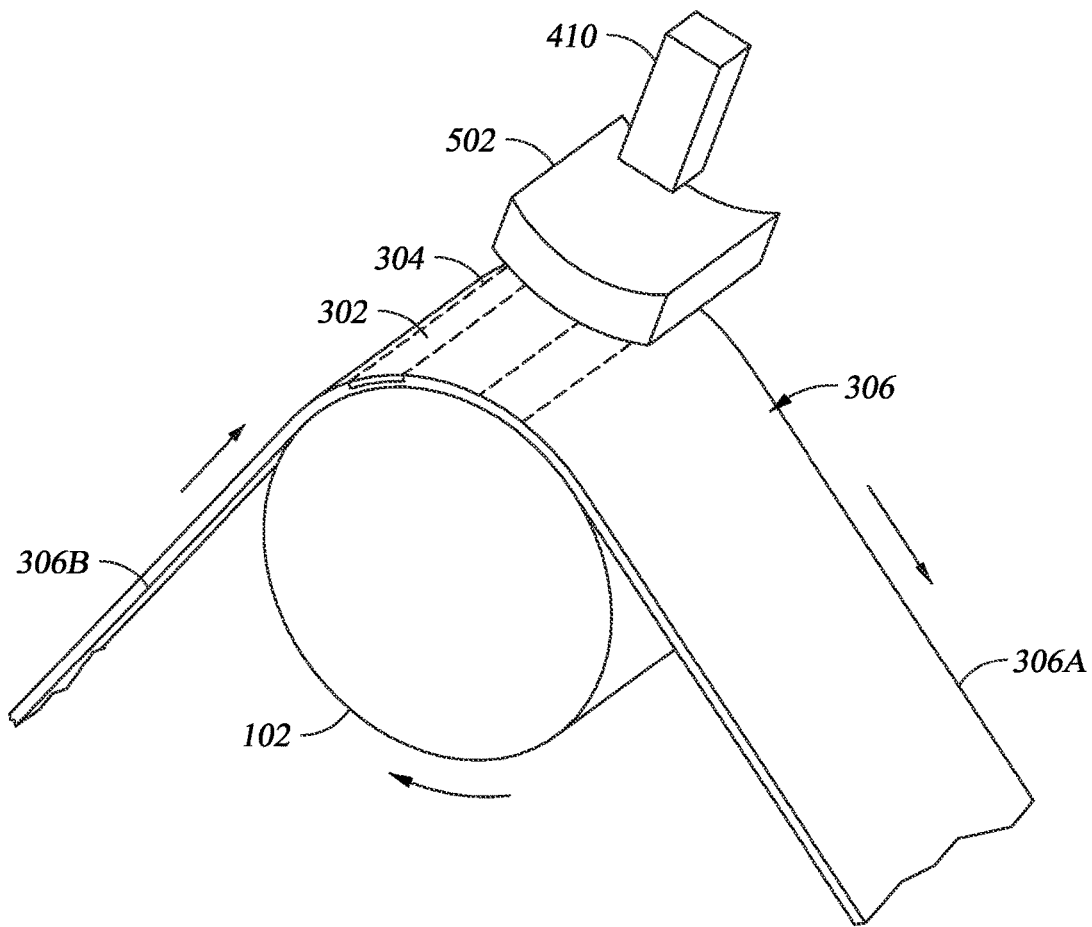
FIG. 5 is a schematic illustration of an apparatus incorporating an image shaper according to one embodiment.

FIG. 5 is a schematic illustration of an apparatus incorporating an image shaper 502 according to one embodiment. The image shaper 502 is similar to a field flattening lens, but is over-powered to create a convex and cylindrical field shape to match the roller 102. Due to the presence of the image shaper 502, the substrate 100, even though on a convex roller, can be properly processed by processing device 410.

Overall, the method to process a web-based substrate may include printing a plurality of alignment markers onto a substrate in a kerf region between products being formed on the substrate. Thereafter, reading the alignment markers once the alignment markers are on the roller. The data collected by reading the alignment markers is processed and the processing device uses the data to compensate for the distortion of the substrate. By compensating for the distortion, a web-based substrate may be properly processed.

While the foregoing is directed to embodiments of the present disclosure, other and further embodiments of the disclosure may be devised without departing from the basic scope thereof, and the scope thereof is determined by the claims that follow.

The invention claimed is:

1. A method of processing a web substrate, comprising:
   detecting that the substrate is distorted, wherein the detecting comprises detecting locations of a plurality of alignment marks on the substrate;
   calculating a distortion of the substrate at steady state based upon the detected alignment marks and a multi-point trailing average, wherein the calculated distortion is a statistical average distortion for the entire substrate; and
   photolithographically processing the distorted substrate based upon the detected distortion.

2. The method of claim 1, wherein the detecting occurs when the substrate is in contact with a roller.

3. The method of claim 1, further comprising adjusting photolithographic conditions for processing the substrate based upon the calculated distortion.

4. The method of claim 3, wherein the calculated distortion is a distortion based upon the detection of the alignment marks that are adjacent to a first product formed on the substrate.

5. The method of claim 1, wherein the photolithographically processing comprises using an image shaper.

6. The method of claim 5, wherein the plurality of alignment marks includes a plurality of laterally extending alignment marks.

7. The method of claim 6, wherein the plurality of alignment marks includes a plurality of longitudinally extending alignment marks.

8. The method of claim 7, wherein the detecting occurs as the substrate is moving in a web processing system.

9. The method of claim 1, wherein the calculated distortion is a distortion based upon the detection of the alignment marks for adjacent to a first product formed on the substrate.

10. A web-based processing apparatus, comprising:
    a roller disposed in a chamber body;
    an alignment measuring device;
    a CPU coupled with the alignment measuring device, wherein the CPU calculates a multi-point trailing average of a distortion at steady state;
    a processing device coupled to the CPU; and
    an image shaper disposed between the processing device and the roller, wherein the image shaper is capable of creating a convex and cylindrical field shape to match a shape of the roller.

11. The apparatus of claim 10, wherein the alignment measurement device comprises a camera.

12. The apparatus of claim 10, wherein the processing device comprises a photolithographic processing device.

13. A processing apparatus, comprising:
    a roller disposed in a chamber body;
    an alignment measuring device for detecting a distortion in a substrate when the substrate is in contact with the roller;
    a CPU to calculate a multi-point trailing average of the distortion in the substrate at steady state;
    a processing device to photolithographically process the distorted substrate; and
    an image shaper capable of creating a convex and cylindrical field shape to match a shape of the roller.

14. The processing apparatus of claim 13, wherein the alignment measurement device comprises a camera.

15. The processing apparatus of claim 13, wherein the distorted substrate is processed based upon detection of alignment marks.

16. The processing apparatus of claim 15, wherein the processing apparatus is a web processing system.

17. The processing apparatus of claim 13, wherein the processing apparatus is a web processing system.

* * * * *